(12) United States Patent
Vaufrey et al.

(10) Patent No.: US 8,674,598 B2
(45) Date of Patent: Mar. 18, 2014

(54) POLYCHROMATIC ELECTRONIC DISPLAY DEVICE WITH ELECTROLUMINESCENT SCREEN

(75) Inventors: David Vaufrey, Grenoble (FR); Christophe Prat, Coueron (FR)

(73) Assignee: Commissariat a l'Energie Atomique, Paris (FR)

( * ) Notice: Subject to any disclaimer, the term of this patent is extended or adjusted under 35 U.S.C. 154(b) by 262 days.

(21) Appl. No.: 13/001,864

(22) PCT Filed: Jun. 16, 2009

(86) PCT No.: PCT/FR2009/000714
§ 371 (c)(1),
(2), (4) Date: Mar. 25, 2011

(87) PCT Pub. No.: WO2010/000976
PCT Pub. Date: Jan. 7, 2010

(65) Prior Publication Data
US 2011/0181178 A1    Jul. 28, 2011

(30) Foreign Application Priority Data
Jul. 3, 2008  (FR) .................................... 08 03790

(51) Int. Cl.
*H01L 51/52*    (2006.01)
(52) U.S. Cl.
USPC .......................................... 313/504; 313/506
(58) Field of Classification Search
USPC .................................. 313/504, 506, 512, 500
See application file for complete search history.

(56) References Cited

U.S. PATENT DOCUMENTS

| 7,173,369 B2 * | 2/2007 | Forrest et al. ................. 313/503 |
| 2006/0181203 A1 | 8/2006 | Meng et al. |
| 2006/0231842 A1 | 10/2006 | Hirakata et al. |

FOREIGN PATENT DOCUMENTS

| EP | 1 119 059 | 7/2001 |
| EP | 1 391 918 | 2/2004 |
| WO | WO 98/34214 | 8/1998 |

OTHER PUBLICATIONS

International Search Report for International Application No. PCT/FR2009/000714.

* cited by examiner

*Primary Examiner* — Karabi Guharay
(74) *Attorney, Agent, or Firm* — Alston & Bird LLP

(57) ABSTRACT

The invention relates to a polychromatic electronic display device with an electroluminescent screen, particularly with organic light-emitting diodes (OLEDs), wherein the polychromatic electronic display device comprises an electroluminescent emission surface and, towards the inside of the device, at least one substrate (2) coated with a pixel matrix, said device including a stack of a plurality of electroluminescent cells ($U_I$ and $U_e$) in which each pixel comprises at least three sub-pixels having different colours. According to the invention, for each pixel, the sub-pixel having the lowest emission wavelength $\lambda_c$, or critical sub-pixel, is exclusively located in the external unit ($U_e$) adjacent to said emission surface, each of the other sub-pixels emitting at a wavelength higher than $\lambda_c$ being exclusively located in an internal unit ($U_I$) relative to said external unit and adjacent to the substrate, the surface area of this critical sub-pixel being higher than that of each of the other sub-pixels.

6 Claims, 2 Drawing Sheets

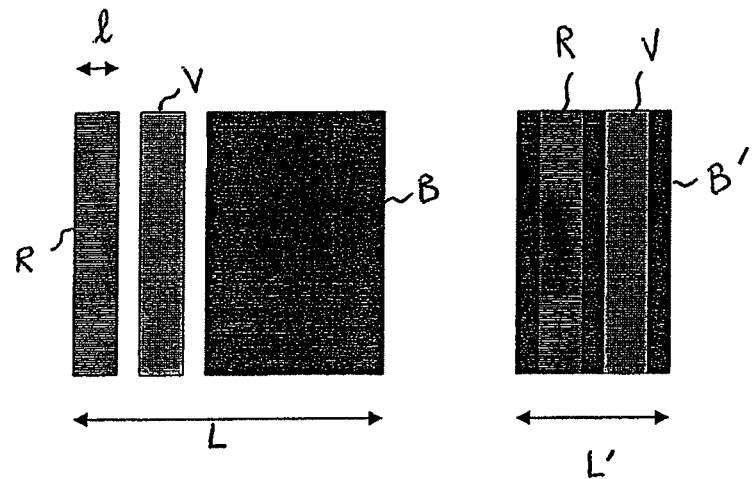
Fig. 1  Fig. 2
(Prior Art)
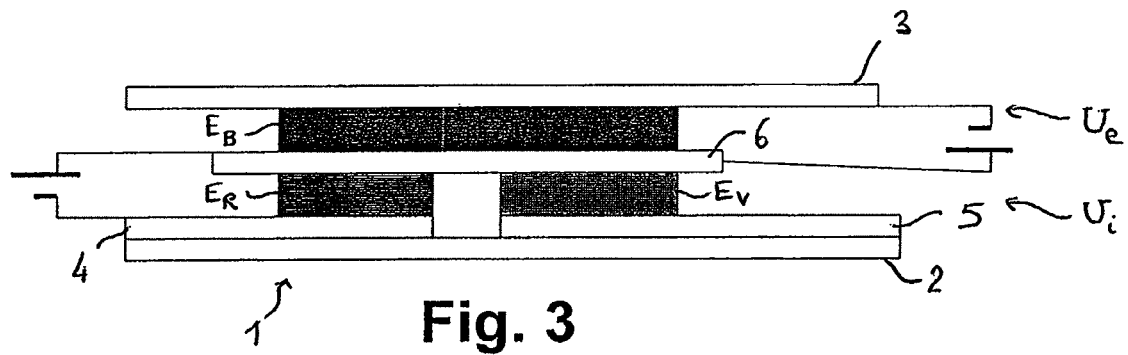
Fig. 3
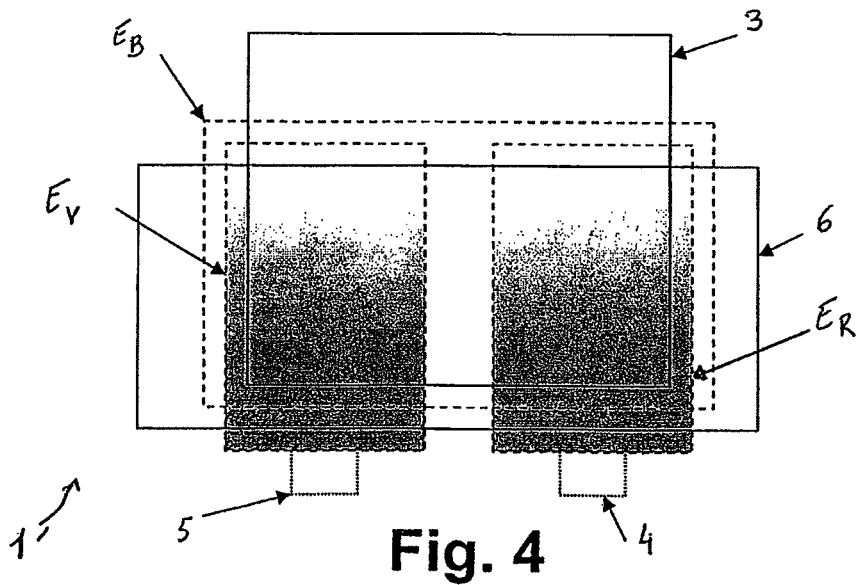
Fig. 4

POLYCHROMATIC ELECTRONIC DISPLAY DEVICE WITH ELECTROLUMINESCENT SCREEN

FIELD OF THE INVENTION

The present invention relates to a polychromatic electronic display device with electroluminescent screen. The invention applies in particular to OLED (organic light-emitting diode) screens.

BACKGROUND OF THE INVENTION

As is known, display devices using OLEDs comprise an emission region formed from a matrix of pixels, each pixel typically consisting of a plurality of differently colored subpixels (RGB: red, green and blue in general), and an electrical connection region arranged adjacent this active region. Each pixel of this OLED matrix usually incorporates a multilayer, light-emitting structure comprising an organic film interposed between two, top and bottom, electrodes that serve as anode and as cathode and one of which is transparent or semitransparent to the light emitted whereas the other is generally reflecting.

To manufacture these screens, organic layers are deposited on each subpixel (one type of layer or multilayer stack per color) by means of a shadow mask. The minimum dimension of the apertures of this shadow mask defines therefore a minimum size for these subpixels. This minimum size for each subpixel may also be imposed by the dimensions of the addressing circuit used to supply electrical power to each subpixel via the aforementioned connection region. It has therefore been sought to increase the resolution of screens by exploiting one of these two parameters i.e. the size of the apertures of the shadow mask or, if it is the limiting factor, the size of the addressing circuit.

Other ways of improving the resolution of such screens have been investigated in the past, consisting in producing stacks of OLED units. In this type of screen, certain subpixels and their corresponding emitting structures are located in what is called an external OLED unit, adjacent the emission side, whereas others are located in what is called an internal OLED unit, adjacent the substrate, an electrode of the pixel thus formed possibly being common to two superposed units.

It has moreover been sought, in these stacks, to minimize the current density flowing in the subpixel that is the most sensitive to aging—that which has the shortest wavelength, typically the blue, in the case of RGB—by increasing its emission area at the expense of that of the other subpixels, so as to increase the lifetime of this critical subpixel and therefore of the whole device.

It is possible, for example, to mention document U.S. Pat. No. 6,747,618, which presents, in its FIG. 8, such a stack, with the two, red and green, subpixels located in the external unit, and the blue subpixel located in the internal unit with an emission area greater than the sum of the areas of the red and green subpixels. It is also possible to mention document U.S. Pat. No. 7,250,722 which describes a stack in which the red and blue subpixels are located in the same internal or external unit and the green subpixel is located in the other unit, while still ensuring that the emission area of the blue subpixel is greater than that of the other subpixels so as to increase its lifetime.

A major drawback of the stacks of OLED units presented in these documents is that the increase in lifetime that they procure, in each pixel, for the critical (typically blue) subpixel, by maximizing the area of its emitting structure, does not allow the resolution of the screen to be optimized, the resolution remaining limited by the shadow mask used for the deposition of the subpixels of smaller dimensions.

Another drawback of known stacks, where the critical (e.g. blue) subpixels are located in the internal OLED unit, is that the photons that they emit are reabsorbed by the emitting structures of the other subpixels in the external OLED unit, resulting in a loss of flux for these photons on the emission side of the screen.

SUMMARY OF THE INVENTION

One object of the present invention is to provide a polychromatic, display device comprising an electroluminescent emission side and, toward the interior of the device, at least one substrate coated with a matrix of pixels, this device comprising a stack of electroluminescent units wherein each pixel consists of at least three differently colored subpixels, device that alleviates these drawbacks.

For this purpose, a device according to the invention is such that, for each pixel, the subpixel having the shortest emission wavelength $\lambda_c$, or critical subpixel, is located only in that of the units, or external unit, which is adjacent this emission side, each other subpixel emitting, at a wavelength longer than $\lambda_c$, being located only in a unit that is internal relative to this external unit and which is adjacent the substrate (as opposed to the external unit that is far relative to this substrate), the area of this critical subpixel being greater than that of each other subpixel.

It is noted that this arrangement of the subpixels within the stack of electroluminescent units according to the invention allows both the resolution and lifetime of the matrix of pixels obtained to be improved. In particular, it is possible to provide an identical visual luminance (in $cd/m^2$) for each of these subpixels, among which the critical subpixel (having the shortest wavelength, for example colored blue, in the case of RGB, indigo or violet) may have, without any dimensional limitation, a much higher emission area than that of each, underlying, other subpixel, resulting in a lifetime that may be very appreciably increased for the display device.

Moreover, the subpixels having smaller dimensions (red and green in the case of RGB) are located directly on the substrate, thus enabling conventional technologies from microelectronics to be used for their fabrication and therefore the production of smaller sized patterns (providing the improved resolution).

Preferably, the area A of this critical subpixel is at least equal to the sum of those of the other subpixels (i.e. $A_{blue} \geq A_{red} + A_{green}$), enabling the resolution and lifetime of the screen to be further improved. Even more preferably, the critical subpixel may extend beyond (i.e. exceed) the edges of the set of underlying, other subpixels.

It is also be noted that the location of the critical subpixels in the unit turned toward the emission side allows to prevent, within each pixel, the aforementioned effect of loss of luminous flux emitted by the critical subpixel.

Advantageously, the critical subpixel may be independently activated from each other subpixel: it is transparent when it is not activated and, when it is activated, emits at said wavelength $\lambda_c$, adding to, as required, the radiation emitted by each other subpixel.

According to another feature of the invention, each pixel advantageously comprises organic, radiation-emitting structures such as OLEDs that form, respectively, the subpixels and that are each interposed between and in electrical contact with two electrodes, serving respectively as anode and as cathode for the corresponding emitting structure, one of these electrodes being transparent or semitransparent and the other electrode possibly being reflective.

Preferably, said stack consists of two electroluminescent units respectively external and internal, said critical subpixel emitting within said external unit and being stacked on the other subpixels that all emit within said internal unit.

According to a first embodiment of the invention, this display device comprises a single, active- or passive-matrix substrate, each pixel being delimited by an external electrode applied on the emitting structure of said critical subpixel, or critical structure, and by a plurality of internal electrodes that are applied on this substrate and on which are deposited, spaced apart, the emitting structures of the other subpixels, or noncritical structures, at least one intermediate electrode being applied on the noncritical structures and/or beneath the critical structure.

According to this first embodiment, this device may comprise a single intermediate electrode that is applied, for each pixel, both beneath said critical structure and on said noncritical structures with which this critical structure is substantially aligned.

As a variant, the device according to this first embodiment may comprise two intermediate electrodes, external and internal, that are superposed and that are separated by at least one inorganic, transparent, electrically insulating layer preferably deposited using the ALD (atomic layer deposition) technique and made from a material chosen from the group consisting of aluminum oxides, silicon oxides, zinc oxides and silicon nitrides, these intermediate electrodes being respectively applied, for each pixel, beneath the critical structure and on the set of noncritical structures. In this variant, the internal electrodes and the external intermediate electrode may each form a (semi)transparent anode, and the internal intermediate electrode and the external electrode may then each form a reflecting cathode. The thickness of this layer will possibly be optimized using simulation so as to maximize the luminous flux extracted from the internal and external units.

In this case, for each electroluminescent unit, the preferred arrangement of an emitting structure interposed between a bottom anode and a top cathode is found again.

It is noted that the aforementioned inorganic, transparent material that forms the insulating layer used in this variant could also be used for the encapsulation of the screen according to the invention.

According to a second embodiment of the invention, the display device comprises two, respectively external and internal, substrates that are each active- or passive-matrix substrates and that are joined to each other at their periphery by beads of adhesive forming a sealed encapsulation for the device, the external substrate being provided with regularly spaced, critical emitting structures that each form a critical subpixel, and the internal substrate being provided with regularly spaced, noncritical emitting structures that each form at least one of the other subpixels and that are separated from these critical structures by an electrical insulator, the two matrices formed by these substrates being connected to independent, electrical power supply circuits.

It is noted that the use of these two substrates, on which are deposited the emitting structures, does not truly complicate the process of fabricating the display device according to the invention because it is not necessary, in this second embodiment, to precisely align the critical and noncritical emitting structures deposited opposite each other, and above all because the encapsulation of the screen is achieved solely by the aforementioned beads of adhesive forming a hermetic enclosure.

This device furthermore provides a very high resolution and less destructive modes of operation for the electroluminescent units, as will be explained in the following.

According to this second embodiment, said insulator is formed by the vacuum gap separating these critical and noncritical structures, so as to overcome factors limiting the efficiency of each critical subpixel by controlling the luminous interference between these structures.

Advantageously, according to this second embodiment, said substrates are separated from each other by a distance of less than 2 pm so as to minimize the emissions from a noncritical structure toward a neighboring noncritical structure and maximize them toward the critical structure opposite.

According to another general feature of the invention, said subpixels may for example consist of three subpixels respectively red, green and blue, said critical subpixel located only in said external unit being a subpixel emitting in the blue, and the other subpixels located only in said internal unit being subpixels emitting in the red and/or in the green.

According to another feature of the invention, especially common to these first and second embodiments, the emitting structure of each of the subpixels other than said critical subpixel is able to selectively emit, depending on the voltage applied to it, at least two different radiations both having wavelengths higher than that of this critical subpixel so as to form, in succession, at least bicolor, noncritical subpixels.

In the aforementioned example of subpixels emitting in the blue, the red and the green, the emitting structure of each noncritical subpixel may then comprise two different emitting materials able to emit in the red at low voltages and in the green at higher voltages, so as to obtain bicolor subpixels.

It is noted that these at least bicolor, noncritical subpixels have the advantage, in this first embodiment of the invention, of simplifying the addressing of the electroluminescent units by requiring half as many internal electrodes for the corresponding electroluminescent units and, in this second embodiment of the invention, of also simplifying the structure of the internal substrate.

Generally, for the display devices as a whole according to the present invention, it is noted that they may be sealingly encapsulated by various means, especially comprising:

for the first embodiment, the bonding of a transparent protection sheet for example made of glass or plastic and provided with optical color filters on its side joined to the screen—or else the screen is covered with one or more encapsulation layers that may be formed from the aforementioned inorganic, transparent material; and for the second embodiment, the beads of adhesive deposited between the two substrates and forming the aforementioned hermetic enclosure.

BRIEF DESCRIPTION OF THE DRAWINGS

Other advantages, features and details of the invention will become clear from the rest of the description that follows, with reference to the appended drawings that are given solely by way of example and in which:

FIG. 1 is a schematic top view of an arrangement according to the prior art of three, respectively red, green and blue, subpixels of an electroluminescent screen;

FIG. 2 is a schematic top view of an arrangement, according to the principle of the invention, of these three subpixels, distributed in two superposed units of an electroluminescent screen;

FIG. 3 is a partial, schematic, cross-sectional view of a display device according to the first embodiment of the invention using the stacking principle of FIG. 2;

FIG. 4 is a schematic top view of the essential components of the stack of a display device according to a variant of FIG. 3.

DETAILED DESCRIPTION OF THE INVENTION

Figure 5:
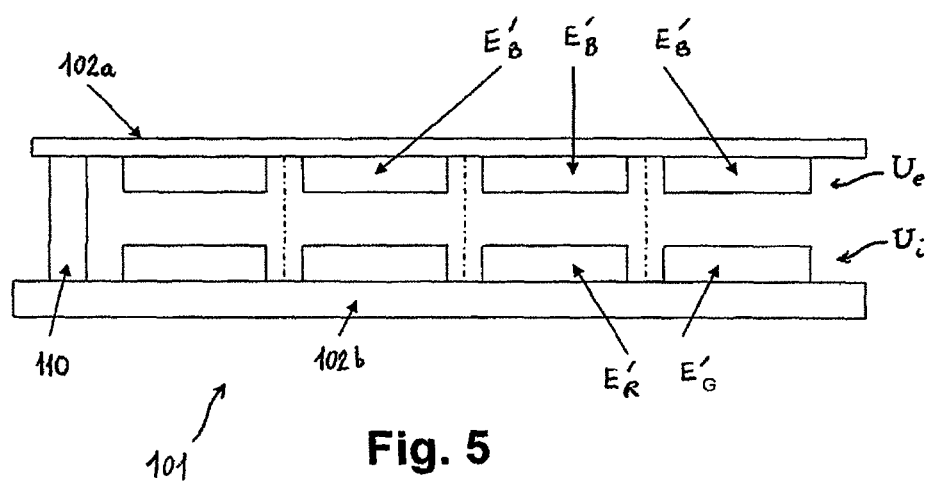
FIG. 5 is a partial, schematic, cross-sectional view of a display device according to the second embodiment of the invention.

The display devices 1, 1', 101 according to the invention that are described below with reference to FIGS. 2 to 5 are OLED display devices comprising, in a known way, at least one substrate 2, 102a, 102b, usually made of silicon, coated with a matrix of pixels that surmounts an integrated circuit structure serving to address each pixel and possibly comprising, for example, for each pixel, two transistors and a capacitor or more complicated circuits, and which structure is connected to an electrical connection region (not illustrated) for establishing a potential difference between electrodes 3 to 6 in contact with which are interposed organic film (monolayer or multilayer, not shown) multilayer emitting structures. As is explained below, these electrodes 3 to 6 each serve as anode or cathode and at least one of them is transparent to the light emitted by the pixels so as to radiate this emitted light to the exterior of the device 1, 1', 101. As regards the organic film interposed between these electrodes 3 to 6, it is designed to transfer the electrons and the holes that come from the electrodes 3 to 6 and which are recombined so as to generate excitons and therefore the light emission.

Shown in FIG. 1 is a known arrangement of three subpixels, R, G, B (respectively red, green and blue), for each pixel of an OLED screen matrix in which it has been sought to maximize the size of the subpixel B, having the shortest wavelength, at the expense of that of the subpixel R and of the subpixel G, which have been reduced to the dimensional limit 1 imposed by the size of the apertures of the shadow mask used for the deposition of these subpixels and/or that of the addressing circuit for the power supply of each subpixel. In this way, the current density in the subpixel B, which, as is known, is the most sensitive to ageing, has been minimized so as to increase the lifetime of this subpixel B having the largest emission area, and a pixel of dimension L in the direction of the succession of the three subpixels R, G and B, has been obtained.

Illustrated in FIG. 2 is the general principle according to the invention, using a stack of two, respectively internal (i.e. opposite the emission side of the screen) and external (i.e. adjacent this emission side), OLED units, wherein, for each pixel, the blue subpixel B' is located solely in the external unit and the red R and green G subpixels are located solely in the internal unit, with an emission area for the subpixel B' which is equal to or greater than the sum of the respective emission areas of the two other subpixels R and G. It is seen in FIG. 2 that this subpixel B' advantageously exceeds at each end the edges of the set of subpixels R and G and that is has a reduced dimension L' relative to the corresponding dimension L of FIG. 1.

Depending on the desired color, the subpixels R, G and B' may be invoked independently or simultaneously, the superposed subpixel B' being transparent when it is not activated, so as not to alter the emission of the subpixels R and G in this case. Once activated, the subpixel B' emits radiation that is added, as required, to that of the subpixels R and G.

This particular arrangement of the subpixels R, G and B' in this stack, combined with the choice of a maximum area for the subpixel B', enables both the lifetime of this blue subpixel to be optimized and the resolution to be increased. In particular, this location of the subpixel B' next to the emission side of the screen enables the flux of blue photons to be preserved intact by avoiding reabsorption of the latter by the subpixels R and G.

By way of indication, the area of each subpixel in a screen according to the invention may vary from about 400 $\mu m^2$ to about 90,000 $\mu m^2$.

The display device 1 according to the first embodiment of the invention, which is illustrated in FIG. 3, comprises a single, active- or passive-matrix substrate 2, each pixel being delimited:

by an external electrode 3 applied on the emitting structure $E_B$ of the subpixel B' and forming for example a reflecting cathode;

by two internal or back electrodes 4 and 5 which are applied on this substrate 2 and on which are respectively deposited, spaced apart (preferably separated by a gap), the emitting structures $E_R$ and $E_G$ of the subpixels R and G, these electrodes 4 and 5 forming, for example, transparent or semitransparent anodes; and by an intermediate electrode 6 that surmounts these emitting structures $E_R$ and $E_G$ and on which is applied the emitting structure $E_B$, this electrode 6 forming for example both a cathode for the internal OLED unit $U_i$ and an anode for the external OLED unit $U_e$.

As is visible in FIG. 3, the edges of the emitting structure $E_B$ are substantially aligned with those of the emitting structure $E_R$ and those of the emitting structure $E_G$ although, as illustrated in FIG. 4, this alignment may only be approximate for the device 1'. On this subject, it may be noted that this precise alignment is not essential, whether in terms of colorimetry (in that the luminance of the subpixels R, G, B' may be adjusted by addressing as a function of desired color and pixels invoked) or in terms of resolution (in that the maximum elementary area illuminated is no greater than the size of the pixel).

As a variant, the display device 1 or 1' could comprise not one but two, internal and external, intermediate electrodes that are superposed and that are separated by an inorganic, transparent, electrically insulating layer, and which are respectively applied, for each pixel, beneath the emitting structure $E_B$ and on the two structures $E_R$ and $E_G$. This layer, preferably deposited using the ALD technique, may be advantageously made of a material chosen from the group consisting of aluminum oxides, silicon oxides, zinc oxides and silicon nitrides.

In this stack configuration, the two internal electrodes and the external intermediate electrode may each form a transparent or semitransparent anode, and the internal intermediate electrode and the external electrode may then each form a reflecting cathode, enabling, for each electroluminescent unit $U_i$ and $U_e$, the preferred arrangement of an emitting structure $E_R$, $E_V$ or $E_B$ interposed between a bottom anode and a top cathode, to be found.

According to another variant of this first embodiment, the subpixels R and G are made as a single bicolor subpixel R/G that has the property of emitting in the red at low voltages and in the green at higher voltages. For this purpose, for each bicolor subpixel, a multilayer emitting structure is used which consists of at least two different materials emitting respectively in the red and the green—this is for example the following:

anode/p-doped HTM014/NPB/Irppy-doped TMM004/TER04-doped TMM004/Alq3/n-doped Bphen/cathode, where the materials Alq3 and Bphen are available from Aldrich and where the other materials are available from Merck Germany.

It is noted that this variant with R/G bicolor subpixels enables the addressing of each of the OLED units to be simplified in comparison to the units of FIGS. 3 and 4 that require four independent electrodes.

Generally, with reference to this first embodiment of the invention, it should be noted that the stack obtained makes it possible to specifically optimize the optical cavity of the blue subpixel so as to increase the output optical coupling, whereas a compromise is found for the other underlying red and green subpixels, if it is desired to deposit common transport layers.

Again for this first embodiment of the invention, it should be noted that the or each intermediate electrode must be structured, this being achievable for example by deposition of this electrode by means of a conventional shadow mask.

The device 101 according to the second embodiment of the invention, illustrated in FIG. 5, comprises two, external 102a and internal 102b, active- or passive-matrix substrates (commonly called backplanes by those skilled in the art) joined by peripheral beads of adhesive 110 forming a sealed encapsulation. The external substrate 102a is provided with, on its side turned toward the other substrate 102b, regularly spaced structures $E'_B$ emitting in the blue that each form a blue subpixel in contact with a pair of electrodes (not illustrated), and the internal substrate is provided with regularly spaced emitting structures $E'_R$ and $E'_G$ that each form a red and/or green subpixel in contact with a pair of electrodes (not illustrated) and which are separated from the structures $E'_B$ by the gap forming the electrical insulator. The two matrices formed by these substrates 102a and 102b are respectively connected to independent electrical power supply circuits (not illustrated).

This spatial separation between the emitting structures $E'_B$ and the emitting structures $E'_R$ and $E'_G$ advantageously enables factors limiting the efficiency of each blue subpixel to be overcome by controlling the luminous interference between these structures $E'_B$, $E'_R$ and $E'_G$.

As indicated above, the use of the two substrates 102a and 102b on which are deposited the emitting structures $E'_B$, $E'_R$ and $E'_G$ does not truly penalize the fabrication of the device 101, because it is not necessary to precisely align these structures $E'_B$, $E'_R$ and $E'_G$ and because the encapsulation of the screen is obtained, very simply, by beads of adhesive 110 alone.

This device 101 furthermore provides a very high resolution and less destructive modes of operation for the units $U_i$ and $U_e$. This is because the spatial separation of the emitting structures of these two units $U_i$ and $U_e$ enables, on the one hand, factors limiting the efficiency, especially noticeable for the emitting structures $E'_B$, to be overcome, and, on the other hand, these very sensitive structures $E'_B$ to be operated in parallel, with lower current densities and therefore with a longer lifetime.

Advantageously, the substrates 102a and 102b are separated from each other by a distance of less than 2 μm, so as to avoid parallax errors by minimizing the emissions of a structure $E'_R$ or $E'_G$ toward a neighboring structure $E'_R$ or $E'_G$ so as to focus them on the structure $E'_B$ opposite.

Of course, this display device 101 of FIG. 5 requires the connection of electrical power supply circuits (called drivers) that are specific to the two matrices deposited on the substrates 102a and 102b, i.e. with twice the number of strands as compared to the devices 1, 1' having a single matrix.

As a variant and as indicated above for the first embodiment of the invention, it is possible, advantageously, to make R/G bicolor subpixels emitting either in the red or in the green depending on the voltage applied, instead of and in place of the spaced-out arrangement of red and green subpixels on the backplane 102b. Such an R/G bicolor emitting structure may for example have the following configuration:

backplane/reflecting electrode/p-doped HTL/EBL/green EL/red EL/HBL/n-doped ETL/(semi)transparent electrode, where HTL stands for hole transport layer, EBL stands for electron blocking layer, EL stands for emissive layer, HBL stands for hole blocking layer and ETL stands for electron transport layer.

As regards the structure $E'_B$ emitting in the blue, this may for example have the following configuration:

backplane/(semi)transparent electrode/p-doped HTL/EBL/blue EL/HBL/n-doped ETL/(semi) transparent electrode.

In the aforementioned examples, it is noted that the transfer layers (HTL and ETL) of the two emitting structures (the blue, external structure and the red/green, internal structure) are doped, but that this is not necessary. Thus, for example, at least one of the two emitting structures (advantageously the blue structure) could be undoped.

The semitransparent electrodes and the optical cavities receiving these subpixels may be optimized, so as to maximize the efficiency of these OLED units and the luminous-emission cones, via the inter-electrode gap and the distances between diodes.

It is noted that the precise alignment of the emitting structures of these two backplanes 102a and 102b is not as essential as for the single backplane screens, except with a view to optimizing the total luminance because the inter-pixel regions of the top matrix 102a conceal the flux emitted by the pixels of the bottom matrix 102b. However, a misalignment does not induce a loss of resolution in the device 101.

In addition, advantageously, for each blue subpixel an emission area is chosen that is twice as large as that of each green or red subpixel. The resolution of the screen then corresponds to the size of each blue subpixel and the addressing of the screen takes account of this size difference between subpixels so as to compensate for the resolution differences of the two backplanes 102a and 102b.

To summarize, the major advantage of this device 101 is a considerable increase in definition, provided by these two backplanes 102a and 102b, and also a considerable increase in OLED unit lifetime, without however being penalized by a need for precise alignment of the subpixels.

The invention claimed is:

1. A polychromatic, electronic display device comprising an electroluminescent emission side and, toward the interior of the device, a single active- or passive-matrix substrate coated with a matrix of pixels, this device comprising a stack of two electroluminescent units wherein each pixel consists of at least three differently colored subpixels, each pixel comprising organic radiation-emitting structures that form respectively the subpixels and that are each interposed between and in electrical contact with two electrodes, one of these electrodes being transparent or semitransparent, wherein for each pixel, the subpixel having the shortest emission wavelength $\lambda_c$, or critical subpixel, is located only in that of the units, or external unit, which is adjacent said emission side, each other subpixel, emitting at a wavelength longer than $\lambda_c$, being located only in a unit that is internal relative to this external unit and which is adjacent the substrate, the area of this critical subpixel being greater than that of each other subpixel, each pixel being delimited by an external electrode applied on the emitting structure of said critical subpixel, or critical structure, and by a plurality of internal electrodes that are applied on said substrate and on which are deposited, spaced apart, the emitting structures of the other subpixels, or noncritical structures, and wherein the device comprises a single intermediate electrode that is applied, for each of said pixels, beneath said critical structure and also on said noncritical structures with which this critical structure is substantially aligned.

2. The device as claimed in claim 1, wherein said critical subpixel is able to be independently activated from each other subpixel by being designed to be transparent when it is not activated and, when it is activated, to emit at said wavelength $\lambda_c$, adding to, as required, the radiation emitted by each other subpixel.

3. The device as claimed in claim 1, wherein the area of said critical subpixel is at least equal to the sum of those of the other subpixels.

4. The device as claimed in claim 1, wherein the emitting structure of each of the subpixels other than said critical subpixel is able to selectively emit, depending on the voltage applied to it, at least two different radiations both having wavelengths higher than that ($\lambda_c$) of this critical subpixel so as to form, in succession, at least bicolored, noncritical subpixels.

5. The device as claimed in claim 4, wherein the emitting structure of each noncritical subpixel comprises two different emitting materials able to emit in the red at low voltages and in the green at higher voltages.

6. The device as claimed in claim 1, wherein said subpixels consist of three subpixels respectively red, green and blue, said critical subpixel located only in said external unit being a subpixel emitting in the blue, and the other subpixels located only in said internal unit being subpixels emitting in the red and/or in the green.

\* \* \* \* \*

UNITED STATES PATENT AND TRADEMARK OFFICE
CERTIFICATE OF CORRECTION

PATENT NO. : 8,674,598 B2
APPLICATION NO. : 13/001864
DATED : March 18, 2014
INVENTOR(S) : Vaufrey et al.

It is certified that error appears in the above-identified patent and that said Letters Patent is hereby corrected as shown below:

Title page,
Item (73) Assignee: "Commissariat a l'Energie Atomique" should read
--Commissariat a L'energie Atomique et aux Energies Alternatives--.

Signed and Sealed this
Twenty-fourth Day of June, 2014

Michelle K. Lee
*Deputy Director of the United States Patent and Trademark Office*